(12) United States Patent
LaBerge

(10) Patent No.: US 6,467,043 B1
(45) Date of Patent: Oct. 15, 2002

(54) ADJUSTING AND MEASURING THE TIMING OF A DATA STROBE SIGNAL WITH A FIRST DELAY LINE AND THROUGH ADDITIONAL DELAY LINE ADAPTED TO RECEIVE PULSE SIGNAL

(75) Inventor: Paul A. LaBerge, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/363,790

(22) Filed: Jul. 29, 1999

(51) Int. Cl.[7] .............................. G06F 1/04; G06F 12/00
(52) U.S. Cl. ........................ 713/401; 713/400; 713/500
(58) Field of Search ................................. 713/400, 401, 713/500

(56) References Cited

U.S. PATENT DOCUMENTS

| 5,848,109 A | * 12/1998 | Marbot et al. ............... 375/355 |
| 5,948,083 A | * 9/1999 | Gervasi ....................... 710/62 |
| 6,101,612 A | * 8/2000 | Jeddeloh ...................... 713/401 |

* cited by examiner

Primary Examiner—Jeffrey Gaffin
Assistant Examiner—Tammara Peyton
(74) Attorney, Agent, or Firm—Trop, Pruner & Hu, P.C.

(57) ABSTRACT

A method for use with a computer system includes receiving a first data strobe signal from a bus and introducing a delay to the first data strobe signal to produce a second data strobe signal. The method includes determining whether the delay is within a predetermined range of delays, and if not, the method includes adjusting the delay to cause the delay to be within the predetermined range. The second data strobe signal is used to capture data from the bus.

15 Claims, 5 Drawing Sheets

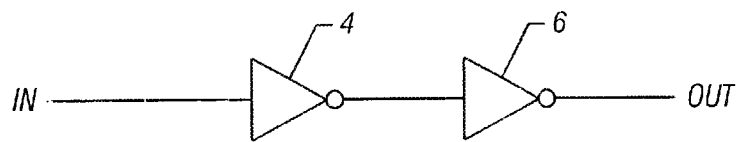
FIG. 1
(PRIOR ART)
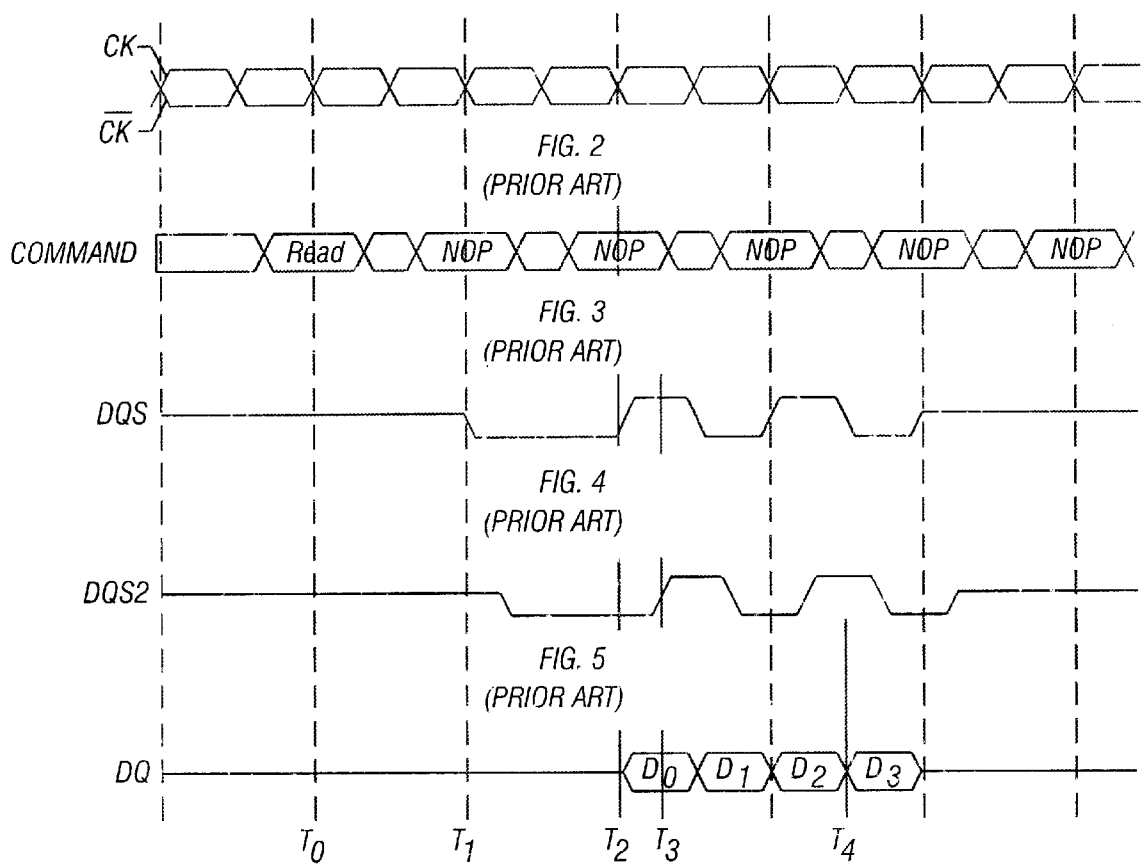
FIG. 2
(PRIOR ART)
FIG. 3
(PRIOR ART)
FIG. 4
(PRIOR ART)
FIG. 5
(PRIOR ART)
FIG. 6
(PRIOR ART)

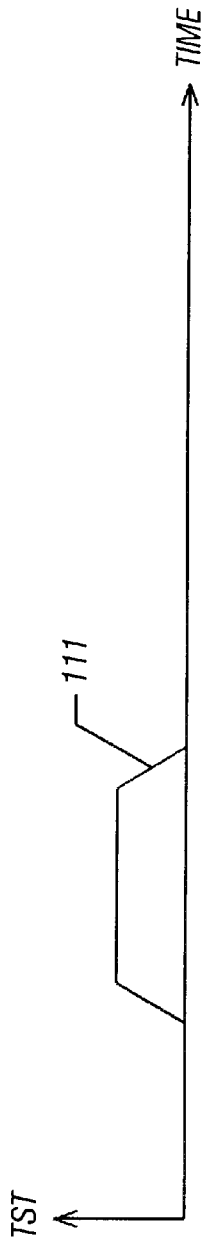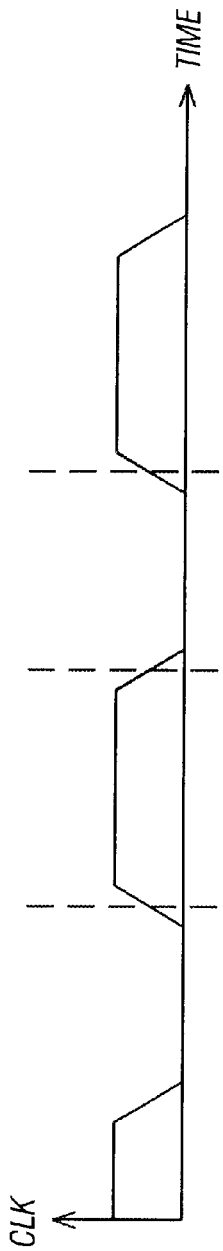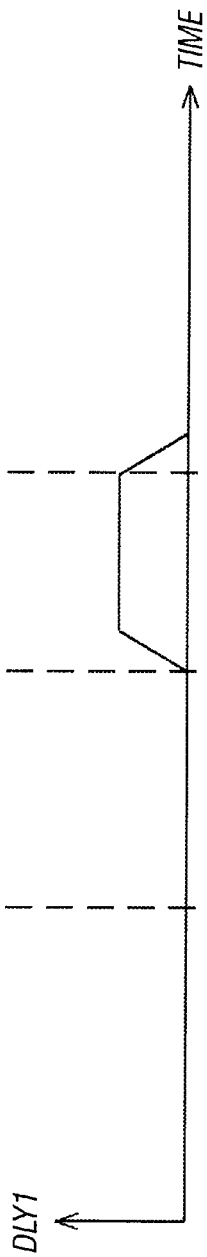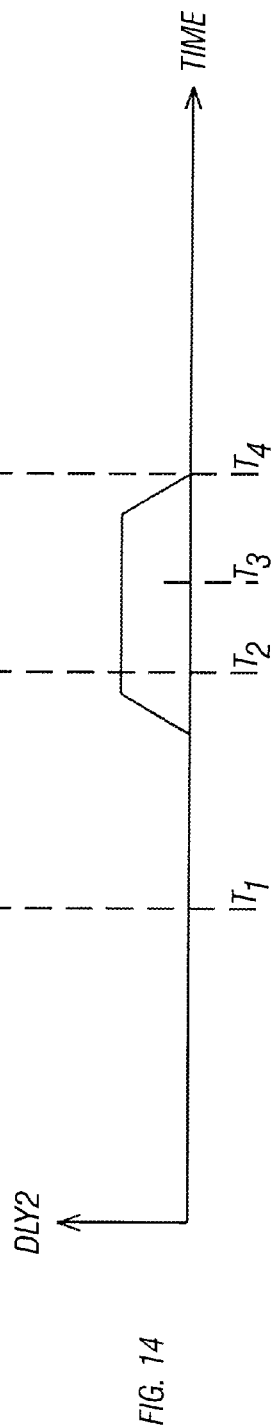
FIG. 11
FIG. 12
FIG. 13
FIG. 14

ADJUSTING AND MEASURING THE TIMING OF A DATA STROBE SIGNAL WITH A FIRST DELAY LINE AND THROUGH ADDITIONAL DELAY LINE ADAPTED TO RECEIVE PULSE SIGNAL

BACKGROUND

The invention relates to adjusting the timing of a data strobe signal.

Referring to FIG. 1, delay elements, such as inverters 4 and 6, may be used for purposes of purposes of delaying a signal (called IN) to produce another signal (called OUT). Such delays may be desirable in the capture of data from a bus. For example, a memory controller may use a data strobe signal called DQS (see FIG. 4) of a double data rate (DDR) memory bus to synchronize the capture of data from the bus. However, before the data is captured, the memory controller may need to shift the DQS signal in time for purposes of aligning the DQS signal with signals (an exemplary signal called DQ for a bit of data is depicted in FIG. 6) of the bus that indicate the data.

In this manner, the DQS signal may be used by a memory controller, for example, during a burst memory read operation (depicted in FIGS. 2, 3, 4 and 6) that occurs over the memory bus. In the read operation, a memory device (a DDR synchronous dynamic random access memory (SDRAM), for example) furnishes signals that indicate the data and furnishes the DQS signal to synchronize the capture of the data by the memory controller. More specifically, the burst read operation may begin near time $T_0$ when the memory controller furnishes signals (to the memory bus) that indicate a read command, as depicted in FIG. 3. In response to the read command, the memory device may begin furnishing the DQS signal at time $T_1$ by driving the DQS signal from a tri-stated level to a logic zero level. From times $T_2$ to $T_4$, the memory device drives the DQS signal in synchronization with a clock signal called CK (see FIG. 2) that is furnished by the memory controller. On each positive and negative edge of the DQS signal, the memory device begins furnishing a different set of signals (to the data lines of the memory bus), each of which indicates a different set of data.

The memory controller may use the edges of the DQS signal to trigger the capture of each set of data from the memory bus. However, due to the finite rise and fall times that are introduced by the memory bus, each data signal may have a narrow window in which the signal accurately indicates its bit of data. This narrow window typically is called a data eye and represents the time interval in which the bit of data (as indicated by the corresponding data signal) is valid. For example, for a particular bit (bit $D_0$) of data (represented by a portion of a signal called DQ (see FIG. 6)), the data eye may occur around time $T_3$, a time approximately near the center of the window in which the DQ signal indicates the $D_0$ bit of data. Thus, because the memory controller may use the edges of the DQS signal to capture the data, the memory controller has to shift DQS signal in time to produce a delayed internal data strobe signal (called DQS2 and depicted in FIG. 5) so that the strobe edges of the DQS2 signal are aligned with the data eyes. Therefore, as an example, the first positive edge of the DQS2 signal is approximately centered in the data eye of the first set of data signals.

Unfortunately, the propagation delay that the memory controller introduces to the DQS signal to produce the DQS2 signal may vary with temperature and voltages of the computer system, i.e., parameters that tend to fluctuate during operation of the computer system. This variation of the propagation delay may cause the strobe edges of the DQS2 signal to occur outside of the data eyes, a misalignment that may cause memory read errors.

Thus, there is a continuing need for an arrangement that addresses one or more of the above-stated problems stated above.

SUMMARY

In one embodiment of the invention, a method for use with a computer system includes receiving a first data strobe signal from a bus and introducing a delay to the first data strobe signal to produce a second data strobe signal. The method includes determining whether the delay is within a predetermined range of delays, and if not, the method includes adjusting the delay to cause the delay to be within the predetermined range. The second data strobe signal is used to capture data from the bus.

In another embodiment, a bridge includes a delay circuit and a memory interface. The delay circuit is adapted to receive a first data strobe signal from a bus, introduce a first delay to the first data strobe signal to produce a second data strobe signal, indicate whether the first delay is within a predetermined range of delays, and if not, adjust the first delay to be within the predetermined range. The memory interface is adapted to use the use the second data strobe signal to capture data from the bus.

Advantages and other features of the invention will become apparent from the following description, from the drawing and from the claims.

BRIEF DESCRIPTION OF THE DRAWING

FIG. 1 is a delay circuit of the prior art.

FIGS. 2, 3, 4, 5 and 6 are waveforms illustrating operation of a memory bus of the prior art during a burst read operation.

FIGS. 11, 12, 13 and 14 are waveforms illustrating operation of the delay circuit of FIG. 10 according to an embodiment of the invention.

DETAILED DESCRIPTION

Figure 7:
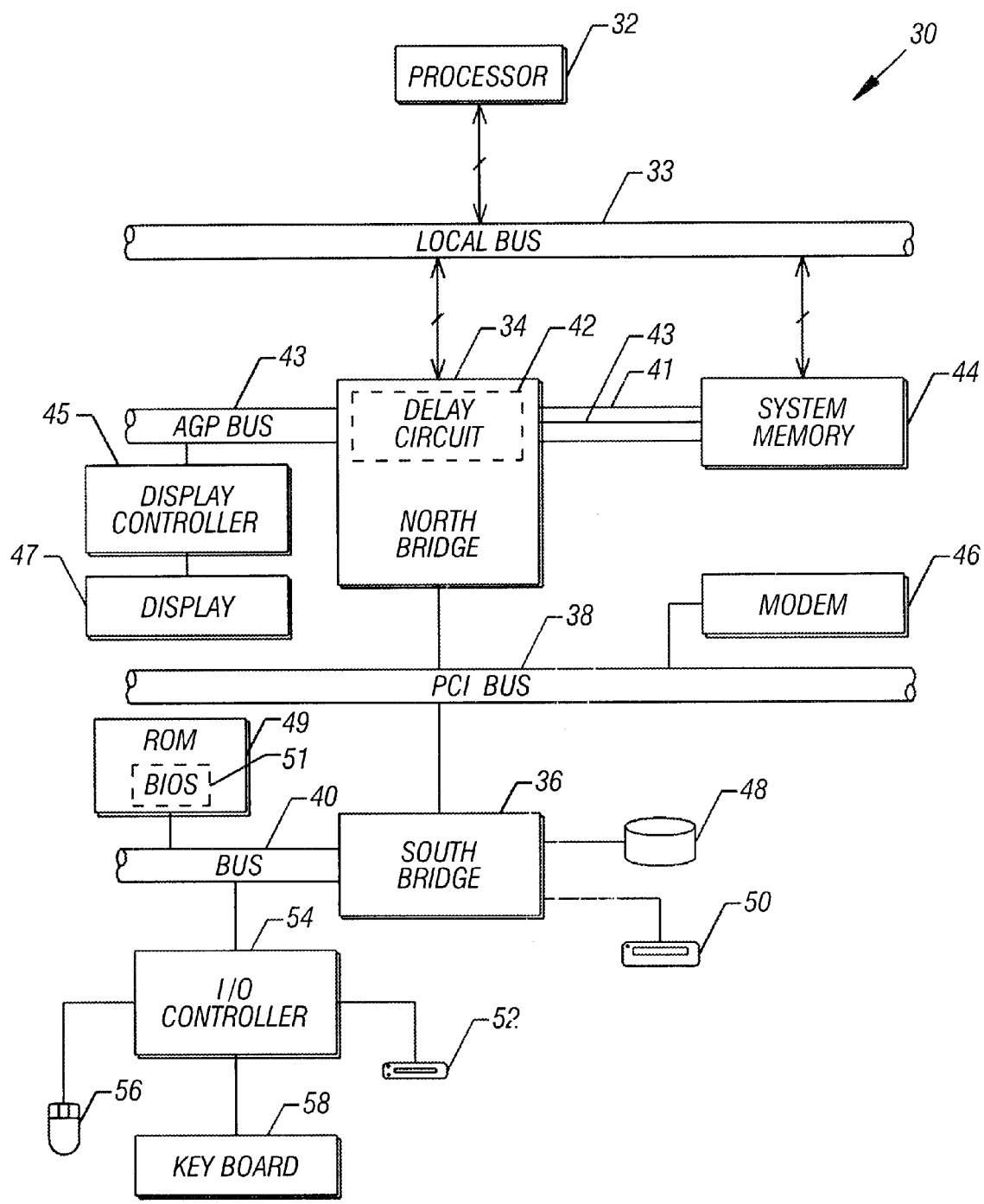
FIG. 7 is a schematic diagram of a computer system according to an embodiment of the invention.

Referring to FIG. 7, an embodiment 30 of a computer system in accordance with the invention includes a north bridge 34 that interfaces busses of the computer system 30 together. For example, the north bridge 34 may receive memory read data from a system memory 44 (a memory formed from double data rate (DDR) synchronous dynamic random access memory (SDRAM) devices, for example) via a memory bus 41. More particularly, the system memory 44 may furnish signals to data lines (of the memory bus 41) that indicate the read data, and the system memory 44 may furnish a data strobe signal to a data strobe line 43 (of the memory bus 41) for purposes of synchronizing the capture of the read data by the north bridge 34. In this manner, the north bridge 34 includes a delay circuit 42 that shifts the data strobe signal in time to place the positive and negative strobe edges of the data strobe signal in the corresponding data eyes of the data signals. The delay introduced by the delay circuit 42 may otherwise tend to vary over time due to such factors as voltage and/or temperature variations. However, the computer system 30 monitors this delay over time and selectively adjusts the delay to keep the delay within a predetermined range of delays. As a result of this arrangement, the strobe edges of the data strobe signal remain in the data eyes despite any voltage and/or temperature variations.

Figure 8:
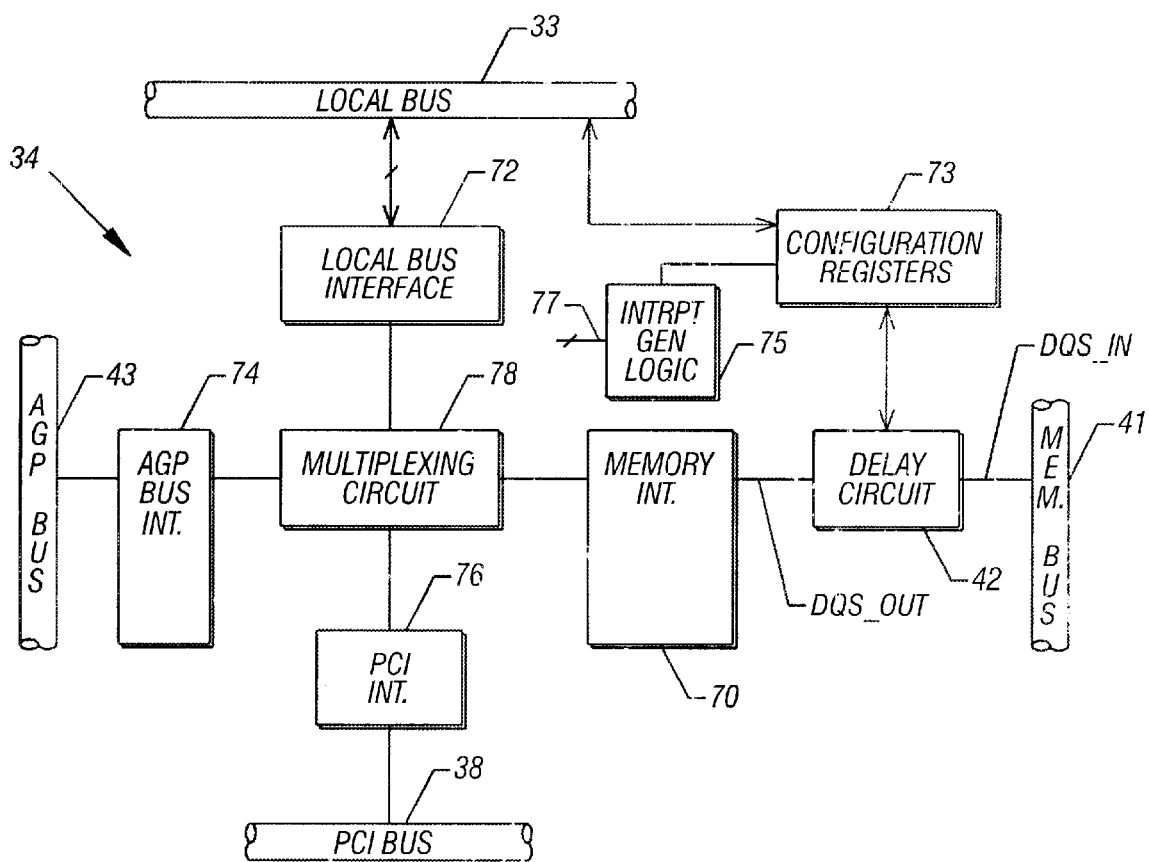
FIG. 8 is a schematic diagram of a bridge of the computer system of FIG. 7 according to an embodiment of the invention.

When the computer system 30 first powers up, a processor 32 (a central processing unit (CPU), as an example) of the computer system 30 may execute basic input/output system (BIOS) code to adjust the delay that is introduced by the delay circuit 42, as described below. For example, referring to FIG. 8, the north bridge 34 may include configuration registers 73 that may be used to adjust the delay. In this manner, the configuration registers 73 may include a register that may be written to by the processor 32 to store a value that sets the delay that is introduced by the delay circuit 42, and the processor 32 may selectively change this value over time to keep the delay approximately the same.

Figure 9:
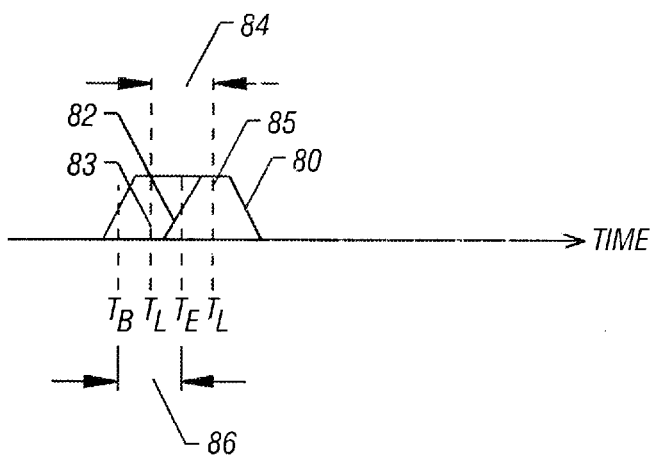
FIG. 9 is an illustration of a relationship between an edge of a data strobe signal and a data eye according to an embodiment of the invention.

To illustrate the delay that is introduced by the delay circuit 42, FIG. 9 depicts a portion 80 of a signal from a data bit line of the memory bus 41. As shown, the portion 80 indicates a logic one bit, and the delay circuit 42 introduces a delay 86 to place a positive edge 82 of the DQS_OUT signal at time $T_E$, a time within the data eye of the portion 80. Because the data bit line may introduce a significant rise and fall times (greater than the rise and fall times depicted in FIG. 9), the delay circuit 42 may interact with the processor 32 to regulate the delay 86 to generally keep the edge 82 within a window 84 inside the data eye, i.e., the delay circuit 42 may regulate the delay 86 to keep the delay 86 within a predetermined range of delays. In this manner, if the positive edge 82 lags behind a trailing edge 83 of the window 84, the delay circuit 42 alerts (as described below) the processor 32 that, in response, increases the delay 86, and if the positive edge 83 leads a leading edge 85 of the window 84, the delay circuit 42 alerts the processor 32 that, in response, decreases the delay 86 to bring the edge 83 back into the window 84.

Figure 10:
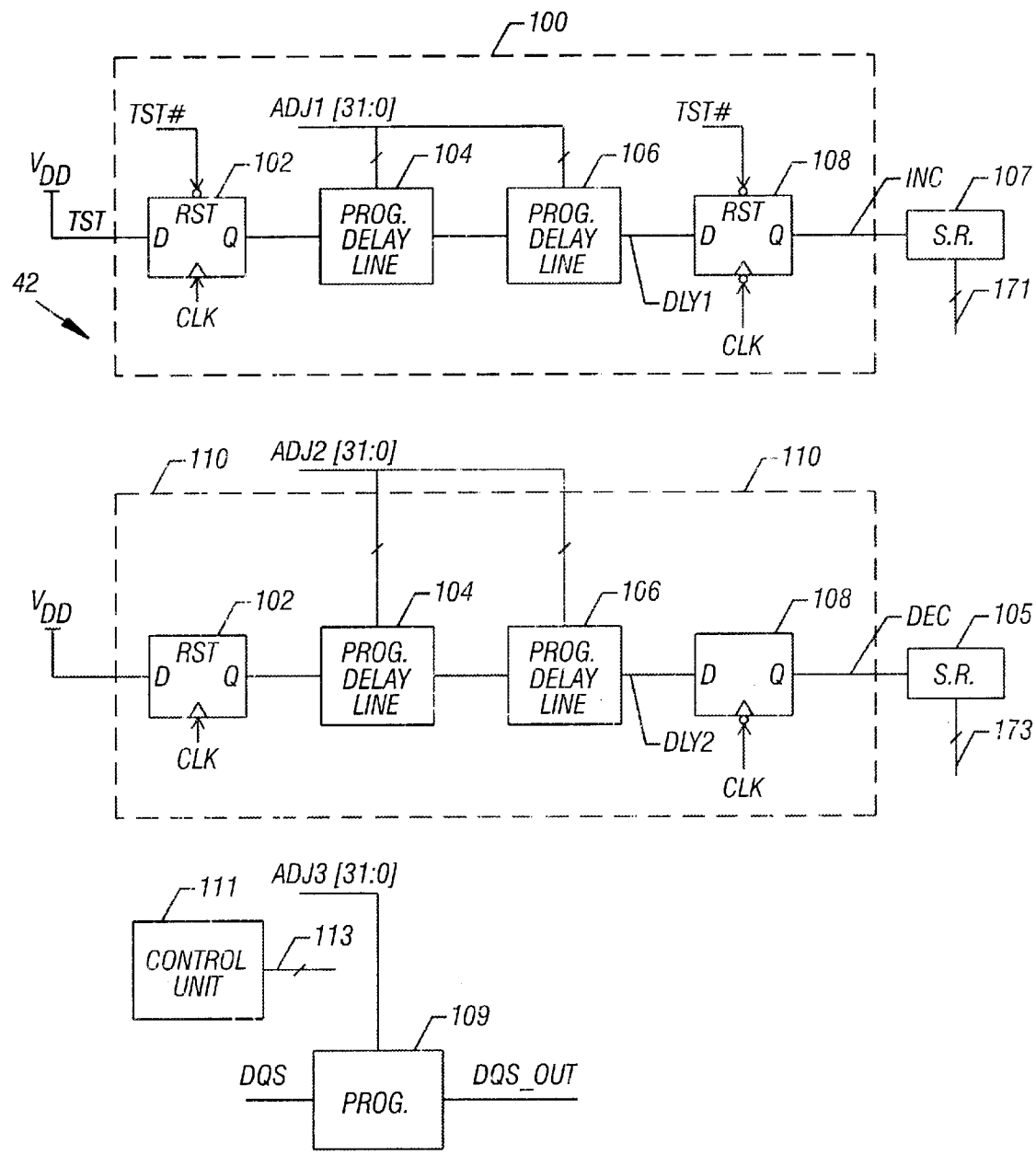
FIG. 10 is a schematic diagram of a delay circuit of the bridge of FIG. 8 according to an embodiment of the invention.

Referring to FIG. 10, the value that is stored in the register to set the delay 86 may program a programmable delay line 109 (of the delay circuit 42), a delay line that delays a data strobe signal (called DQS) from the data strobe line 43 to produce a delayed version of the DQS signal called DQS_OUT. In this manner, the delay line 109 receives signals called ADJ3[31:0] that are indicative of the bits of the register, and the delay line 109 sets the delay based on the logical levels of the ADJ3[31:0] signals. However, because the delay that is introduced by the delay line varies with voltage and/or temperature fluctuations, the value does not indicate an absolute delay, but rather the value indicates a delay that may vary, as noted above. Therefore, for purposes of aiding the processor's selection of the appropriate value, the delay circuit 42 includes circuits 100 and 110 that indicate whether the delay that is introduced by the delay line 109 is within a predetermined range of delays. A delay within this range of delays places the data strobe edges within the corresponding data eye windows.

More particularly, the circuit 100 may include programmable delay lines 104 and 106 that are serially coupled together, and each may be electrically equivalent to the delay line 109. Furthermore, the delay lines 104 and 106 each receive signals called ADJ1[31:0] and may be programmed via the ADJ1[31:0] signals to establish a minimum boundary for the range of acceptable delays for the delay line 109. In some embodiments, a D-type flip-flop 102 (that is clocked by a clock signal called CLK) receives a test signal (called TST) at its input terminal, and the output terminal of the flip-flop 102 is coupled to the input terminal of the delay line 104. The output terminal of the delay line 104 is coupled to the input terminal of the delay line 106, and the output terminal of the delay line 106 produces a signal called DLY1. An input terminal of a D-type flip-flop 108 is coupled to the output terminal of the delay line 106, and the flip-flop 108 is clocked on the negative edge of the CLK signal. The flip-flop 108 produces a signal called INC that when asserted indicates that the delay should be increased, as further described below. The two delay lines 104 and 106 effectively eliminate potential jitter and skew problems.

Referring also to FIGS. 11, 12 and 13, in some embodiments, to determine if the delay is too short, the memory interface 70 may momentarily assert (drive low, for example) the TST signal (see FIG. 11) at time $T_1$ to introduce a pulse 111 that, in conjunction with the circuit 100, tests the delay that is introduced by the delay line 109. In this manner, ideally the pulse 111 should arrive at the output terminal of the delay line 106 (of the circuit 100) after time $T_2$, a time that defines the leading edge of the window in which the delay should expire and is the time at which the next negative edge of the CLK signal occurs. Therefore, if the DLY1 signal is asserted after time $T_2$, the flip-flop 108 maintains the INC signal at a logic zero level to indicate a longer delay is not needed. However, if the DLY1 signal indicates a portion of the pulse 111 at time $T_2$, then the flip-flop 108 asserts the INC signal to indicate a larger delay may be needed.

The circuit 110 has a similar design to the circuit 100 with the differences being pointed out below. In particular, the delay lines 104 and 106 of the circuit 110 each receive signals called ADJ2[31:0] and may be programmed via the ADJ2[31:0] signals to establish a maximum boundary for the range of acceptable delays for the delay line 109. The flip-flop 108 of the circuit 110 is clocked on the positive (not negative) edge of the CLK signal, and the output terminal of the flip-flop 108 furnishes a DEC signal that, when asserted, indicates that the delay may need to be increased. Referring also to FIGS. 11, 12 and 14, in this manner, if the pulse 111 arrives at the output terminal of the delay line 106 after time $T_3$, a time that defines the trailing edge of the window in which the delay should expire (and occurs on the next positive edge of the CLK signal), then the flip-flop 108 maintains the DEC signal at a logic zero level to indicate a shorter delay is not needed. However, if the DLY2 signal indicates a portion of the pulse 111 at time $T_3$, then the flip-flop 108 asserts the DEC signal to indicate a shorter delay may be needed.

In some embodiments, the INC and DEC signals are furnished to shift registers 107 and 105, respectively, that indicate the results of several tests. In this manner, a glitch may appear, for example, as only one set bit in the register 105, 107. As a result, the glitches may be filtered out, and the value used for the delay may be based on a consistent pattern (as indicated by the bits) of tests that indicate the delay is too long or too short. In some embodiments, a predetermined pattern (four consecutive adjustments, for example) are indicated before a change is made to the delay that is introduced by the delay line 109. When this delay is changed, the delays introduced by the delays lines 104 and 106 of circuits 100 and 110 are also changed.

In some embodiments, the delay circuit 42 includes a control unit 111 that has control lines 113 that are coupled to the circuits 100 and 110 and the registers 105 and 107. The control unit 111 changes the delays that are introduced by the delay lines 104 and 106 whenever the register 105, 107 indicates the predetermined pattern.

In other embodiments, the registers 105 and 107 may be coupled to interrupt generation logic 75 (see FIG. 8) that generates an interrupt request when the contents of either the shift register 105 or 107 indicates that the delay needs adjustment. In this manner, the interrupt generation logic 75 may be coupled (via one or more lines 77) to an interrupt controller (not shown) that routes any interrupt request to the processor 32. The interrupt generation logic 75 generates an interrupt only after detecting a consistent pattern of indications (from the register 105 or 107) that establish that the delay is outside of the predetermined range of delays. The registers 105 and 107 may be readable by the processor 32. Thus, after an interrupt request is received from the north bridge 34, the BIOS may cause the processor 32 to read the indications from the registers 105 and 107, and if adjustments need to be made, the BIOS may cause the processor 32 to write a new value to the appropriate register to change the delay. In some embodiments, the BIOS may cause the processor 32 to change the value just before refresh of the system memory 44.

In some embodiments, the ADJ[31:0] signals may indicate coarse adjustments (via the ADJ[31:30 ] signals, for example) and finer adjustments (via the ADJ[30:0] signals, for example) to the delay. In this manner, to determine the appropriate delay, the BIOS may cause the processor 32 to change the coarse adjustment by a fraction of a predefined coarse value (by ¼th of a coarse value, for example) until the delay is within the window. Afterwards, the BIOS may cause the processor 32 to further fine tune the adjustment of the delay.

Referring back to FIG. 7, among the other components of the computer system 30, the north bridge 34 may furnish an interface to an Accelerated Graphics Port (AGP) bus 43 and a Peripheral Component Interconnect (PCI) bus 38. The AGP is described in detail in the Accelerated Graphics Port Interface Specification, Revision 1.0, published on Jul. 31, 1996, by Intel Corporation of Santa Clara, Calif. The PCI Specification is available from The PCI Special Interest Group, Portland, Oreg. 97214.

A display controller 45 may be coupled to the AGP bus 43 and control a display 47. A modem 46 may be coupled to the PCI bus 38. The computer system 30 may also include a south bridge 36 that provides an interface to an input/output (I/O) expansion bus 40 and control operations of a CD-ROM drive 50 and a hard disk drive 48. An I/O controller 54 may be coupled to the I/O expansion bus 40 and receive input from a mouse 56 and a keyboard 58. The I/O controller 54 may also control operations of a floppy disk drive 52. A read only memory (ROM) 49 may be coupled to the expansion bus 40 and store a copy 51 of the BIOS. A shadow copy of the BIOS may be made in the system memory 44 at bootup of the computer system 30.

In this context of this application, the term "processor" may generally refer to at least one central processing unit (CPU), microcontroller or microprocessor, as just a few examples. The phrase "computer system" may refer to any type of processor-based system, such as a desktop computer or a laptop computer, as just a few examples. Thus, the invention is not intended to be limited to the illustrated computer system 30, but rather, the computer system is an example of one of many possible embodiments.

Referring back to FIG. 8, besides the delay circuit 42 and the memory interface 70, the north bridge 34 may also include a local bus interface 72 to receive and decode signals from the local bus 33 and a AGP bus interface 74 to receive a decode signals from the AGP bus 43. The bridge 34 may further include a PCI interface 76 to receive decode signals on the PCI bus 38. A switch, or multiplexing circuit 78, of the north bridge 34 may couple the above-described interfaces together.

Other embodiments are within the scope of the following claims. For example, the number of delay lines 104, 106 in the circuit 100, 110 may be greater than two. As another example, the frequency of the CLK signal may be different than the frequency described by the examples above.

While the invention has been disclosed with respect to a limited number of embodiments, those skilled in the art, having the benefit of this disclosure, will appreciate numerous modifications and variations therefrom. It is intended that the appended claims cover all such modifications and variations as fall within the true spirit and scope of the invention.

What is claimed is:

1. A computer system comprising:
   a memory device adapted to furnish a strobe signal having an edge and at least one data signal having an eye in which said at least one data signal indicates a bit of data;
   a first circuit comprising a first delay line to introduce a delay to the strobe signal to align the edge within the eye and comprising at least one additional delay line adapted to receive a pulse signal separate from the strobe signal, the first circuit being adapted to determine whether the edge is outside of a window of time located inside the eye by measuring a time for the pulse signal to propagate through said at least one additional delay line;
   a second circuit coupled to the first circuit to adjust the delay to realign the edge within the eye when the first circuit indicates the edge is outside of the eye; and
   a memory interface coupled to the delay circuit to use the delayed strobe signal and the data signal to capture the data.

2. The computer system of claim 1, wherein said at least one additional delay line comprises multiple delay lines and each of said multiple delay lines is substantially an electrical equivalent to the first delay line.

3. The computer system of claim 1, wherein the first circuit is further adapted to determine if the edge lags the window.

4. The computer system of claim 1, wherein the first circuit is further adapted to determine if the edge leads the window.

5. The computer system of claim 1, further comprising:
   a register, and
   wherein the first circuit is further adapted to perform several tests to determine if the edge is within the eye and indicate the results via the register.

6. The computer system of claim 1, wherein the first circuit is further adapted to align additional edges of said at least one data signal within additional windows of time located in additional data eyes of said at least one data signal.

7. The computer system of claim 1, wherein the second circuit comprises:
   a processor.

8. A method for use with a computer system, comprising:
   receiving a first data strobe signal from a bus;
   using a first delay line to introduce a first delay to the first data strobe signal to produce a second data strobe signal;

determining whether the first delay is within a predetermined range of delays, the determining comprising routing a pulse signal separate from the strobe signal through at least one additional delay line and basing the determination on a time for the pulse to propagate through said at least one additional delay line;

if the first delay is not within the predetermined range of delays, adjusting the first delay to cause the first delay to be within the predetermined range; and using the second data strobe signal to capture data from the bus.

9. The method of claim 8, wherein the act of adjusting comprises: reprogramming the first delay line to change the first delay.

10. The method of claim 8, wherein the act of determining comprises:

determining if the first delay is less than the delays of the predetermined range.

11. The method of claim 8, wherein the act of determining comprises:

determining if the first delay is greater than the delays of the predetermined range.

12. A bridge comprising:

a delay circuit comprising a first programmable delay line and at least one additional delay line adapted to receive a pulse signal, the delay circuit adapted to:

receive a first data strobe signal separate from the pulse signal from a bus, use the first programmable delay line to introduce a first delay to the first data strobe signal to produce a second data strobe signal, determine whether the first delay is outside of a predetermined range of delays by measuring a time for the pulse signal to propagate through said at least one additional delay line, and if the first delay is not within the predetermined range of delays, adjust the first delay to be within the predetermined range; and a memory interface adapted to use the use the second data strobe signal to capture data from the bus.

13. The bridge of claim 12, wherein said at least one additional delay line comprises multiple delay lines and each of said multiple delay lines is substantially an electrical equivalent of the programmable delay line.

14. The bridge of claim 12, wherein the first circuit is further adapted to determine if the first delay is less than the delays of the predetermined range.

15. The bridge of claim 12, wherein the first circuit is further adapted to determine if the first delay is greater than the delays of the predetermined range.

* * * * *